(12) United States Patent
Craven et al.

(10) Patent No.: US 6,605,952 B2
(45) Date of Patent: Aug. 12, 2003

(54) ZERO CONNECTION FOR ON-CHIP TESTING

(75) Inventors: Don G. Craven, Maple Valley, WA (US); Joe A. Harrison, Olympia, WA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/891,463

(22) Filed: Jun. 27, 2001

(65) Prior Publication Data

US 2003/0001599 A1 Jan. 2, 2003

(51) Int. Cl.⁷ ............................................. G01R 31/02
(52) U.S. Cl. ..................................... 324/754; 324/158.1
(58) Field of Search ................................ 324/754, 755, 324/756, 757, 758, 72.5, 158.1; 439/66, 169

(56) References Cited

U.S. PATENT DOCUMENTS

| | | | | |
|---|---|---|---|---|
| 4,724,377 A | * | 2/1988 | Maelzer et al. | 324/149 |
| 5,049,813 A | * | 9/1991 | Van Loan et al. | 324/754 |
| 5,410,260 A | * | 4/1995 | Kazama | 324/758 |
| 5,420,519 A | * | 5/1995 | Stowers et al. | 324/72.5 |
| 5,424,492 A | * | 6/1995 | Petty et al. | 174/250 |

* cited by examiner

Primary Examiner—Kamand Cuneo
Assistant Examiner—Tung X. Nguyen
(74) Attorney, Agent, or Firm—Kenyon & Kenyon

(57) ABSTRACT

In order to make a connection to a test bus on a printed circuit board within a system or platform for the purpose of testing circuits within the system, a regular pattern of contact points which are coupled to the circuits to be tested are formed on the printed circuit board. The contact points are contacted with a plurality of spring loaded contacts, supported in a pattern which is the same as the pattern of contact points, with the spring loaded contacts being coupled to test equipment for testing the circuits.

14 Claims, 3 Drawing Sheets

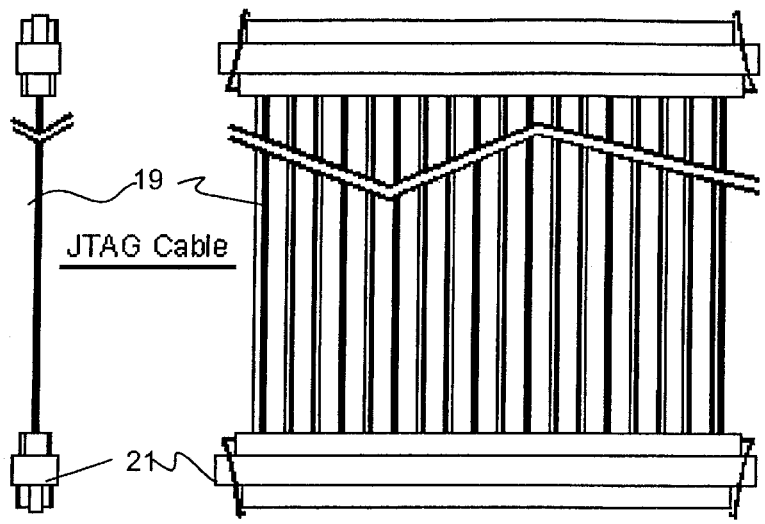
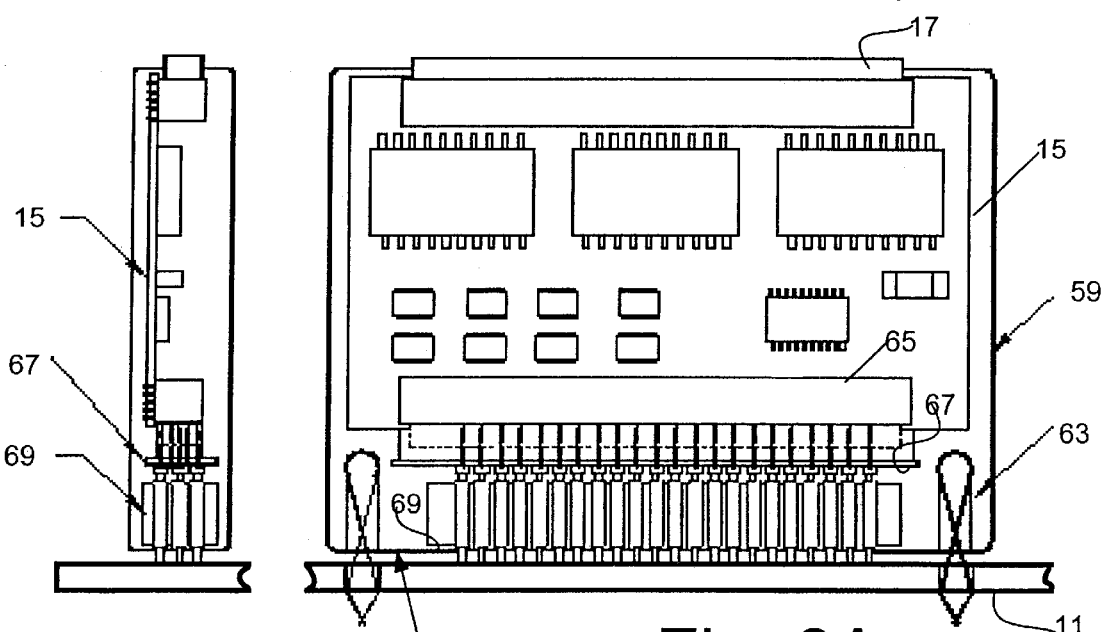
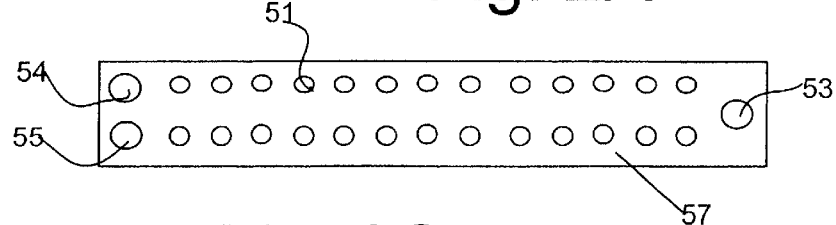

ZERO CONNECTION FOR ON-CHIP TESTING

BACKGROUND OF THE INVENTION

The present invention pertains to system testing. More particularly, the present invention pertains to a headerless interconnect that permit coupling test equipment to a microprocessor or other complex semiconductor circuitry incorporated in silicon chips contained in a system or platform without a connector present on the platform under test.

There are numerous testing schemes for carrying out a system or platform testing available in the art. For example, the IEEE 1149.1 (Joint Test Action Group (JTAG) 1990), provides such a testing system. In a JTAG system, as with other testing systems, the system, which contains circuits, typically on chips, to be tested must be coupled to a testing system. This is typically done in the manner illustrated in FIGS. 1A and 1B showing, respectively, exploded front and side elevation views of a JTAG probe 15, printed circuit board 11 and JTAG cable 19 with connector 21. The traces, in the form of a JTAG bus coupled to circuits to be tested, are on the motherboard or baseboard 11. A header 13 is soldered to the board 11. For example, this may be a 2 mm. header with two rows of 13 pins. A JTAG probe 15 having a matching 2 mm. receptacle 14, shown above the header, plugs into the header when it is desired to do testing. In conventional fashion, probe 15 contains circuits such as buffers and clock drivers.

JTAG probe 15 has a connector 17 at its side opposite receptacle 14. A JTAG cable 19 with a plug 21 on its end, shown above the probe 15, plugs into this connector, and makes a connection with the host which is carrying out the testing.

This arrangement has a number of disadvantages. The socket receptacles in 14 often become weak and do not make adequate connection with pins 13 due to frequent detachment/attachment. Furthermore, the header provides inadequate support when the board 11 is placed in different orientations. For example, if the board 11 is turned to be vertical, the receptacle 14 can become disconnected or make marginal connection with pins 13 because there is no retention mechanism other than the frictional force of the socket receptacles. Even if the board remains fixed, the probe and cable tend to overstress the pins of the header.

It is also the case that the header 13 is removed after the development of a product. As a result, it is not available for testing during manufacturing or for maintenance.

In view of the problems set forth above, there is a need for a way to establish contact with the bus which couples to circuits to be tested that is inexpensive, reliable and which can be used beyond the development stage.

BRIEF DESCRIPTION OF THE DRAWINGS

FIG. 2A is an exploded front elevation view and FIG. 2B is an exploded side elevation view of an embodiment of the zero connection arrangement of the present invention.

FIG. 2C is a plan view of the footprint on the printed circuit board of the embodiment of FIGS. 2A and 2B.

DETAILED DESCRIPTION

Embodiments of the "zero connection" arrangement of the present invention completely avoid the need for a target probe header on the unit under test (UUT) or motherboard. The connector is replaced by test pads which may be like surface mount technology (SMT) pads or any of the types of test point (5) currently in use. The present invention will be explained using JTAG as an example. It should be recognized that this is only by way of example, and that the zero connection system of the present invention is generally applicable when temporary contact with circuits, for example on a board, must be made for testing or other purposes. For example, embodiments of the present invention are useful in carrying out system or platform diagnostics. In accordance with an embodiment of the present invention, the JTAG header is replaced by using a modified JTAG probe that incorporates test probes and, in one embodiment, retention clips integral to the JTAG device. The term "zero connection" refers to the complete elimination of the header on the motherboard. It can also be referred to as a headerless connection. In accordance with embodiments of the present invention, only the JTAG test pads need to be incorporated on the motherboard or UUT.

Embodiments of the JTAG zero connection provide a new method of connecting to the JTAG maintenance and debug port on PC boards. This method eliminates the existing JTAG header which is soldered to the PC board during development. More generally, the method is one for testing circuits on one or more chips mounted to one or more printed circuit boards in the unit under test. Instead of mounting a header for making connections, a regular pattern of test pads, i.e., contact points are formed on the printed circuit board coupled to traces from a test bus leading to circuits to be tested. To carry out testing, the contact points are contacted with a plurality of spring loaded contacts, supported in a pattern which is the same as the pattern of contact points on the printed circuit board. The spring loaded contacts are then coupled to test equipment for testing the circuits, e.g., JTAG test equipment.

In the illustrated embodiment alignment guides are formed on the printed circuit board adjacent to the pattern and the method includes aligning the plurality of spring loaded contacts using the alignment guides. In the illustrated method, coupling the spring loaded contacts to test equipment is via a test probe. Other aspects of this method will be evident from the discussion of illustrated embodiment below.

Figure 1B:
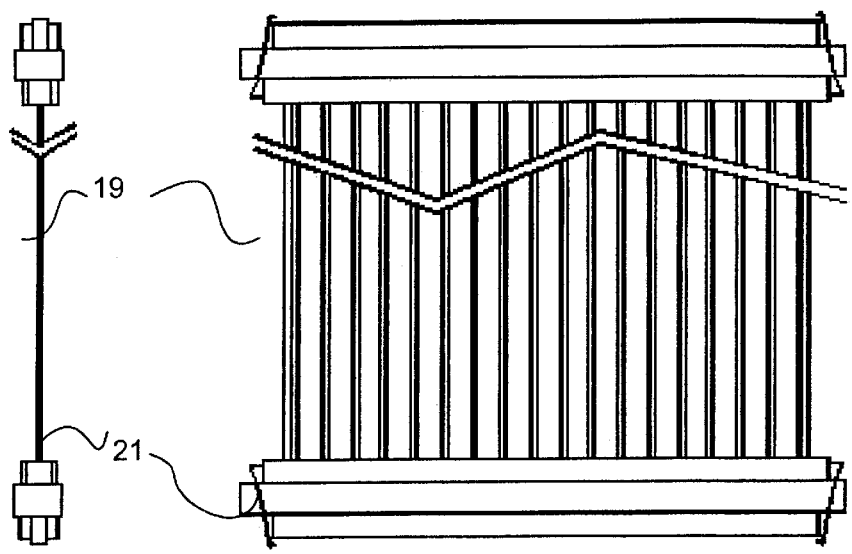
FIG. 1A is an exploded front elevation view and FIG. 1B an exploded side elevation view of a prior art JTAG arrangement.
Figure 1A:
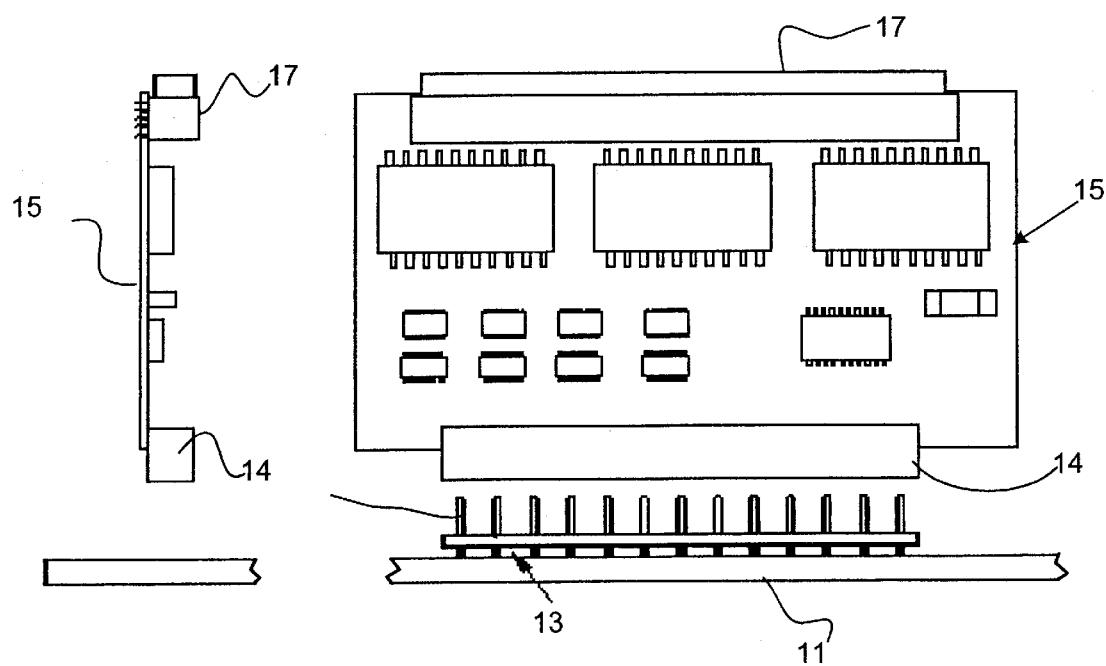

FIG. 2A is an exploded front elevation view and FIG. 2B is an exploded side elevation view of an embodiment of the zero connection arrangement of the present invention. Parts that are the same as those in FIGS. 1A and 1B are given the same reference numerals. On the printed circuit board 11, instead of a header, are a plurality of contact points 51, equal in number to the pins in the header being replaced. These may be of the nature of any conventionally used test points or may be, for example, SMT pads. In the illustrated embodiment, three holes 53, 54 and 55 are provided as the alignment guides. Hole 53 is on one side of the contact area footprint 57 and holes 54 and 55 on the other side. They are placed in predetermined alignment with the contact points 51 and provide a means of alignment.

The test probe printed circuit 15 is enclosed in a probe housing 59. In place of the receptacle on the probe printed circuit 15 is a double ended probe assembly 69 to be described in more detail below. Replacement is accomplished without impact to electronics on the probe printed circuit 15. Also provided in the probe housing 59 is a probe retention mechanism adaptable for various substrate thickness. In the illustrated embodiment this mechanism comprises three crossing spring clips 63 adapted to be inserted in the holes 53–55 on the substrate, e.g., printed circuit board 11, to hold the probe assembly 61 firmly in contact with the contact points 51.

The elements making up the double ended probe assembly in the illustrated embodiment include a connector 65 at the end of board 15 opposite connector 17. In one embodiment these connectors may be identical, for example, AMP Mictor Microstrip 40 Position connectors. Obviously this particular connector is not required; any connector with the necessary number of pins for the particular testing application may be used. A transition printed circuit board 67 interfaces, on one side with connector 65 and on the other side has a pattern of contacts identical to those shown in FIG. 2C which are on the board.

Figure 3A:
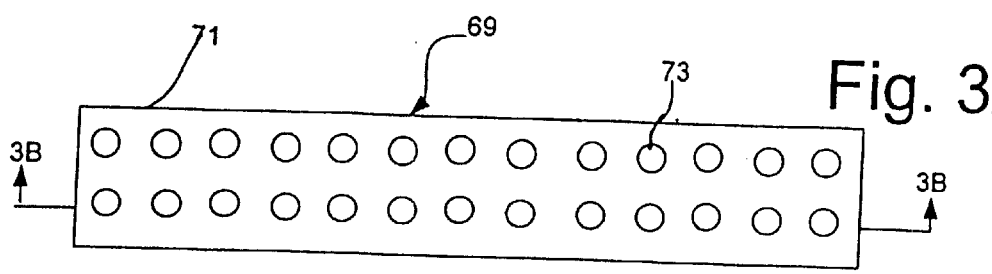
FIG. 3A is a plan view and FIG. 3B a cross-sectional view of the test probe block of the embodiment of FIGS. 2A and 2B.
Figure 3B:
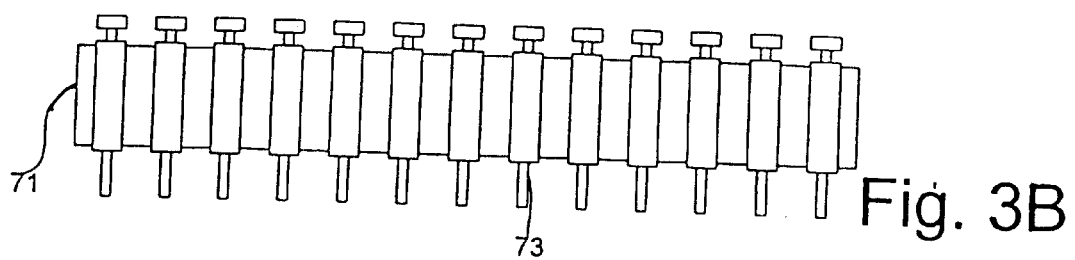

In between board 67 and board 11 is a spring loaded pin assembly 69, shown in more detail in FIGS. 3 and 3B. This assembly is made up of a retaining block 71 and a plurality of pins 73. The pattern of the pins is identical to the pattern of contacts 51 in FIG. 2C. In this embodiment, the pins 73 are spring loaded on both ends. The block 71 is rigidly retained in the housing 59 with the tops of pins 73 pressed into contact with the contacts on the bottom of the transition printed circuit board 67.

In the embodiment of FIGS. 2A and 2B, the probe is shown attached to the printed circuit board 11 by means of the crossing spring clips 63 which provide a robust coupling. Although this is a particularly good way to make the connection, other attachment arrangements may be used. In this embodiment the use of three attachment points insures proper alignment of the pins 73 with the contact points 51.

Embodiments of the zero connection arrangement of the present invention provide a number of advantages. There is no cost to the printed circuit board during production. The arrangement makes it possible to provide a more mechanically stable connection to the printed circuit board, for example by using the double spring clips. Furthermore the debug port established by the contacts in footprint 57 allows testing during production testing and fault isolation and, in addition allows for OEM field service use. In addition embodiments of the present invention provide for better signal quality than the existing connection method. Due to the degradation of contact integrity on existing 2 mm. interface connector to unit under test and from lack of support of the probe during testing the female contacts "open" up and do not provide consistent contact integrity over time.

Specific embodiment of the present invention have been illustrated and described. However, numerous adaptations within the spirit of the invention are possible. For example, the substrate of board 15 could be lengthened to provide a mounting solution to be integrated for the probe assembly. It would be further possible to incorporate the retention mechanism into the probe assembly as well making the probes and retention solution all replaceable as one assembly mounted to the JTAG substrate without changing any electrical of the substrate. The lengthened substrate that supports the probe assembly could also be used for signal conditioning on the far side of the substrate.

Also a modified "stabber" probe using the technology of the present invention could be implemented for functional testing. For a method carrying out functional testing in a "stabber" test fixture, retention would not be needed, however, alignment of the probe would be through tapered or stepped guide pin registration.

Thus, although several embodiments are specifically illustrated and described herein, it will be appreciated that modifications and variations of the present invention are covered by the above teachings and within the purview of the appended claims without departing from the spirit and intended scope of the invention.

What is claimed is:

1. A method of coupling to circuits in a system including a printed circuit board for the purpose of testing the circuits comprising:
   a. forming, on the printed circuit board, a regular pattern of contact points which are coupled to circuits to be tested;
   b. contacting said contact points with a plurality of spring loaded contacts coupled to test equipment for testing said circuits, supported in a pattern which is the same as said pattern of contact points;
   c. forming alignment guides on said printed circuit board adjacent said pattern and aligning said plurality of spring loaded contacts using said alignment guides;
   d. coupling inputs of said test probe to an transition printed circuit board having a pattern of contact points the same as the pattern on said printed circuit board;
   e. supporting said spring loaded contacts in a block;
   f. supporting said block, said test probe and said transition printed circuit board in a housing;
   g. coupling said spring loaded contacts to said contact points on said transition printed circuit board; and
   h. engaging the alignment guides on the printed circuit board with alignment guides coupled to said housing.

2. The method according to claim 1 wherein the testing is conducted via JTAG signals.

3. Apparatus for coupling to circuits in a system which includes a printed circuit board for the purpose of testing the circuits using a regular pattern of contact points on the printed circuit board, which contact points are coupled to the circuits to be tested, comprising;
   a. a test probe assembly including a test probe having on the end thereof a plurality of spring loaded contacts coupled to said test probe, said contacts supported in a pattern which is the same as said pattern of contact points;
   b. alignment guides formed on said printed circuit board adjacent said pattern and mating alignment guides on said test probe assembly;
   c. an transition printed circuit board having a pattern of contact points the same as the pattern on a printed circuit board to be contacted by said test probe assembly coupled to inputs of said probe;
   d. a block supporting said spring loaded contacts, said spring loaded contacts coupled to said contact points on said transition printed circuit board; and
   e. a housing supporting said block, said test probe and said transition printed circuit board, said mating alignment guides also coupled to said housing.

4. Apparatus according to claim 3 wherein said test probe is a JTAG test probe.

5. Apparatus according to claim 3 wherein said spring loaded contacts comprise contact pins which are spring loaded on both ends, one of said spring loaded ends of each of said spring loaded contacts contacting a contact point on said transition printed circuit.

6. Apparatus according to claim 5 wherein said test probe has a first connector on one edge for coupling said probe to test equipment and further including a second connector on another edge of said probe, contacts of said second connector coupled to the contact points on said transition printed circuit board.

7. Apparatus according to claim 5 wherein the alignment guides on the printed circuit board comprise holes in said board and said mating alignment guides comprise crossing spring clips.

8. A system for testing circuits in a system including a printed circuit board comprising:
   a. a regular pattern of contact points on the printed circuit board, which contact points are coupled to the circuits to be tested;
   b. a test probe assembly including a test probe and having on the end thereof a plurality of spring loaded contacts coupled to said test probe, said contacts supported in a pattern which is the same as said pattern of contact points; and
   c. a cable to couple said test probe to host test equipment;
   d. alignment guides formed on said printed circuit board adjacent said pattern and mating alignment guides on said test probe assembly;
   e. an transition printed circuit board having a pattern of contact points the same as the pattern on said printed circuit board to be contacted by said test probe assembly coupled to inputs of said probe;
   f. a block supporting paid spring loaded contacts, said spring loaded contacts coupled to said contact points on said transition printed circuit board; and
   g. a housing supporting said block, said test probe and said transition printed circuit board, said mating alignment guides also coupled to said housing.

9. A system according to claim 8 wherein said test probe is a JTAG test probe.

10. A system according to claim 8 wherein said spring loaded contact comprise contact pins which are spring loaded on both ends, one of said spring loaded ends of each of said spring loaded contacts contacting a contact point on said transition printed circuit.

11. A system according to claim 10 wherein said test probe has a first connector on one edge for coupling said probe to said cable and further including a second connector on another edge of said probe, contacts of said second connector coupled to the contact points on said transition printed circuit board.

12. A system according to claim 10 wherein said second connector is identical to said first connector.

13. A system according to claim 8 wherein the alignment guides on the printed circuit board comprise holes in said board and said mating alignment guides comprising crossing spring clips.

14. A system according to claim 8 wherein the alignment guides on the printed circuit board comprise holes in said board and said mating alignment guides comprise tapered or stepped guide pin registration.

* * * * *

UNITED STATES PATENT AND TRADEMARK OFFICE
CERTIFICATE OF CORRECTION

PATENT NO.    : 6,605,952 B2  
DATED         : August 12, 2003  
INVENTOR(S)   : Don G. Craven et al.

It is certified that error appears in the above-identified patent and that said Letters Patent is hereby corrected as shown below:

<u>Title page, Item [54] and Column 1, line 1,</u>  
Title, "ON-CHIP" should be -- CIRCUIT --

Signed and Sealed this

Tenth Day of August, 2004

JON W. DUDAS  
*Acting Director of the United States Patent and Trademark Office*